United States Patent
Hendrickson

(10) Patent No.: US 9,646,669 B2
(45) Date of Patent: May 9, 2017

(54) PROGRAMMING MEMORY ELEMENTS USING TWO PHASE BOOST

(71) Applicant: Avago Technologies General IP (Singapore) Pte. Ltd., Singapore (SG)

(72) Inventor: Nicholas T. Hendrickson, Burnsville, MN (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/884,446

(22) Filed: Oct. 15, 2015

(65) Prior Publication Data

US 2017/0053687 A1    Feb. 23, 2017

Related U.S. Application Data

(60) Provisional application No. 62/206,069, filed on Aug. 17, 2015.

(51) Int. Cl.
*G11C 11/00* (2006.01)
*G11C 11/16* (2006.01)

(52) U.S. Cl.
CPC .............................. *G11C 11/1675* (2013.01)

(58) Field of Classification Search
CPC .................................................. G11C 11/1675

USPC ........ 365/148, 189.011, 158, 189.16, 210.12
See application file for complete search history.

(56) References Cited

U.S. PATENT DOCUMENTS

| 2011/0080768 A1* | 4/2011 | Li ............................ G11C 8/08 365/148 |
| 2013/0301337 A1* | 11/2013 | Kamalanathan ... G11C 13/0002 365/148 |

\* cited by examiner

*Primary Examiner* — Fernando Hidalgo
(74) *Attorney, Agent, or Firm* — Sterne, Kessler, Goldstein & Fox P.L.L.C.

(57) ABSTRACT

Memory devices, such as MRAM devices, are described that comprise memory elements for storing data and configuration logic for programming memory elements using a two phase boost. The memory devices perform the two phase boosting to program anti-parallel data values during a first programming phase and to program parallel data values during a second programming phase that is subsequent to the first programming phase. The voltage boost is provided by a high percentage of memory elements in a memory device by simultaneously transitioning the source line of the memory elements from a reference voltage to a source voltage during the first programming phase to effectively double the activation voltage for gates of transistors in the memory elements to program anti-parallel data values. Methods are also described for programming memory elements using a two phase boost.

20 Claims, 6 Drawing Sheets

| Phase | Actions |
|---|---|
| 0 - Setup | • Voltage setup |
| 1 - Program | • Selective boost<br>• Program parallel or anti-parallel data values |
↖100
FIG. 1
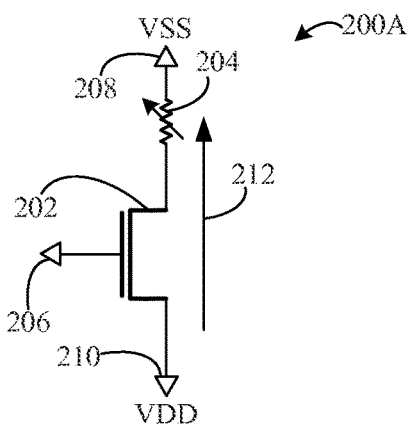
FIG. 2A
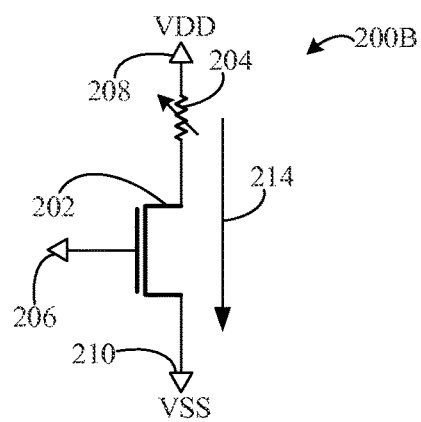
FIG. 2B
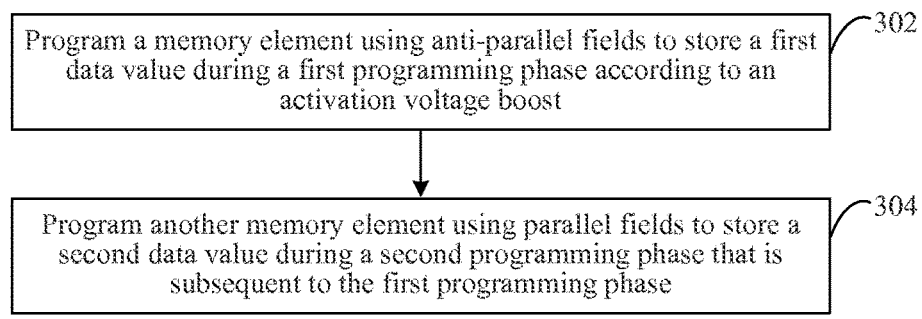
FIG. 3

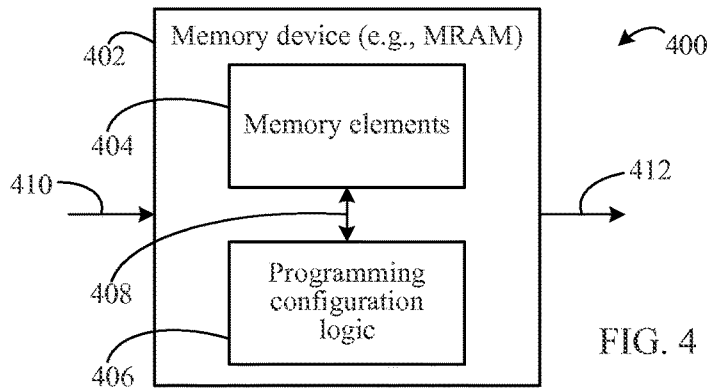
FIG. 4
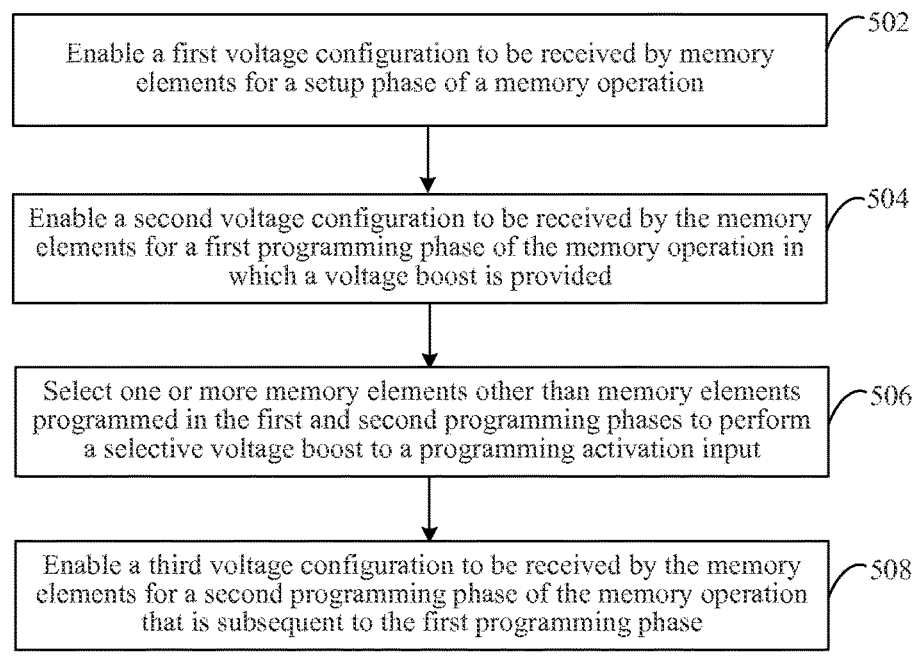
FIG. 5
| Phase | Actions |
|---|---|
| 0 - Setup | • Setup |
| 1 – Program anti-parallel | • Voltage boost<br>• Program anti-parallel values |
| 2 – Program parallel | • Optional selective boost<br>• Program parallel values |
FIG. 6

PROGRAMMING MEMORY ELEMENTS USING TWO PHASE BOOST

CROSS-REFERENCE TO RELATED APPLICATIONS

This application claims the benefit of U.S. Provisional Application No. 62/206,069, filed on Aug. 17, 2015, the entirety of which is incorporated by reference herein.

BACKGROUND

I. Technical Field

Embodiments described herein relate to semiconductor-based memory devices and systems.

II. Background Art

Devices, such as personal computers and laptops, cellular and smart phones, PDAs, digital cameras, smart cards, home electronics and entertainment devices, etc., include memory devices such as random access memory (RAM) and magnetoresistive RAM (MRAM) for data storage. MRAM uses magnetic fields generated by current flow to program data values in MRAM storage elements. For instance, when two magnetic fields run in parallel, a corresponding first value (e.g., '0' or '1') is programmed, and when the two magnetic fields run in opposing directions (anti-parallel), a corresponding second value (e.g., '1' or '0') is programmed.

Current techniques for MRAMs involve a traditional, single phase boost to activate storage elements for programming, where both parallel and anti-parallel programming are performed using a single phase. This type of voltage boost may be referred to herein as a traditional, selective boost. That is, one or more storage elements that are not to be currently programmed or that are unused, may be selected to provide the selective boost during the single programming phase.

BRIEF SUMMARY

Methods, systems, and apparatuses are described for memories with two phase programming for parallel and anti-parallel memory elements, substantially as shown in and/or described herein in connection with at least one of the figures, as set forth more completely in the claims.

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

FIG. 1 shows a table of MRAM phases used for programming, according to an example embodiment.

FIG. 2A shows a circuit diagram of a memory element for anti-parallel programming in a first programming phase, according to an example embodiment.

FIG. 2B shows a circuit diagram of a memory element for parallel programming in a second programming phase, according to an example embodiment.

FIG. 3 shows a flowchart for programming phases of the memory elements of FIGS. 2A-2B that use a two phase boost, according to an example embodiment.

FIG. 4 shows a block diagram of a memory device, according to an example embodiment.

FIG. 5 shows a flowchart for programming phases of memory elements that use a two phase boost, according to an example embodiment.

FIG. 6 shows a chart of memory voltage value for phases used in programming with a two phase boost, according to an example embodiment.

Embodiments will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Introduction

Figure 7:
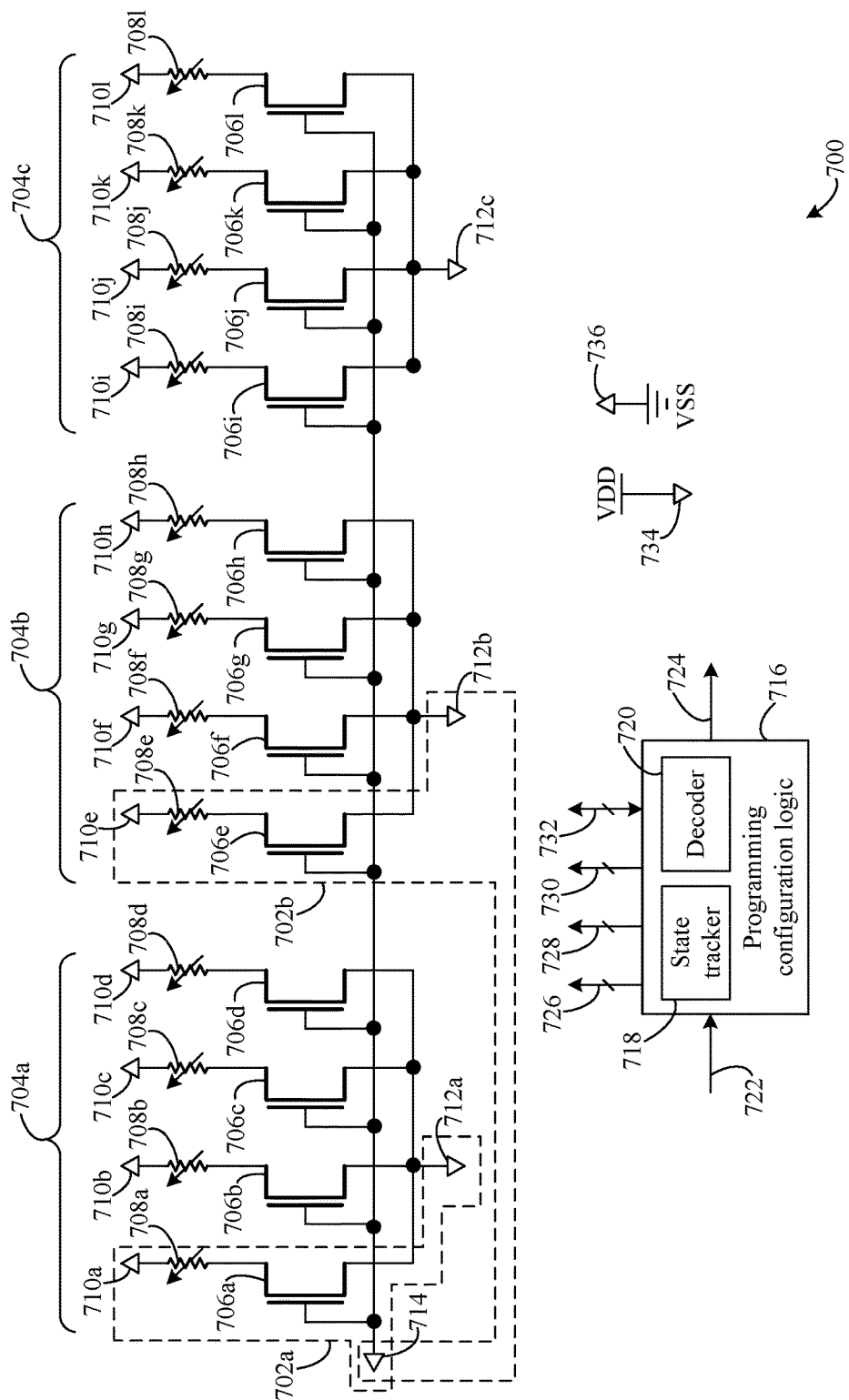
FIG. 7 shows a circuit diagram of a memory device, according to an example embodiment.

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In the discussion, unless otherwise stated, adjectives such as "substantially," "approximately," and "about" modifying a condition or relationship characteristic of a feature or features of an embodiment of the disclosure, are understood to mean that the condition or characteristic is defined to be within tolerances that are acceptable for operation of the embodiment for an application for which it is intended.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

Still further, it should be noted that the drawings/figures are not drawn to scale unless otherwise noted herein.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner. That is, the embodiments described herein are not mutually exclusive of each other and may be practiced and/or implemented alone, or in any combination.

II. Example Embodiments

The example techniques and embodiments described herein may be adapted to various types of systems and devices, for example but without limitation, communication devices (e.g., cellular and smart phones, etc.), communication systems and components (e.g., switches, routers, etc.), computers/computing devices, computing systems, electronic devices, gaming consoles, home electronics and entertainment devices, and/or the like, that use memory such as MRAM. While the embodiments herein may be described with respect to memory devices and/or MRAM as conceptual and/or illustrative examples for descriptive consistency, other types of memory implementations, such as but not limited to resistive RAM (RRAM), are also contemplated for implementing the disclosed techniques. It is contemplated herein that in various embodiments and with respect to the illustrated figures of this disclosure, one or more components described and/or shown may not be included and that additional components may be included.

One boosting scheme that may be utilized in embodiments is a selective boosting scheme. As shown in table 100 of FIG. 1, after an initial setup phase in which setup voltages are applied to storage elements, parallel or anti-parallel data values are programmed in a subsequent programming phase using a selective boosting scheme (i.e., selective boost).

The techniques described herein provide novel memory systems and devices, such as MRAM systems and devices. MRAM systems and devices may include a plurality of memory elements used to store data. Memory elements may include a transistor that acts as an activation component for the memory elements and a magnetic tunneling junction (MTJ) device or other resistive device that acts as a resistive element to "store" data programmed into the memory elements. For instance, voltages may be applied across the drain and source of the transistor, and when activated via the gate, the direction of the current flow (and its corresponding magnetic field) through the transistor and the MTJ device programs the memory element. That is, the resistive value of the MTJ device may vary according to the direction of applied currents and corresponding magnetic fields, and the voltage drop across the MTJ element may be determined and be associated with either a first programmed value or a second programmed value. For example, a flow of current through the MTJ device and transistor from drain to source may result in parallel magnetic fields applied to the MTJ device and a corresponding first value being programmed. A flow of current through the MTJ device and transistor from source to drain may result in anti-parallel magnetic fields applied to the MTJ device and a corresponding second value being programmed.

The described techniques and embodiments provide memory systems and devices, e.g., MRAMs, configured to program parallel and anti-parallel data values in separate programming phases. In embodiments, three phases may be performed in a memory operation, such as a memory write operation: an initial setup phase (phase 0), a first programming phase (phase 1), and a second programming phase (phase 2) subsequent to the first programming phase. In the initial setup phase (phase 0), a Word Line (WL) signal used to activate programming is brought to an operating voltage VDD. Memory elements to be programmed with parallel data values have their bit lines (BLs) brought to operating voltage VDD, and memory elements to be programmed with anti-parallel data values have their BLs brought to a reference voltage VSS. These voltage values on the BLs for memory elements to be programmed may remain constant for each of the programming phases. The source lines (SLs) of all memory elements are brought to reference voltage VSS in phase 0. After phase 0, the first programming phase (phase 1) begins to program anti-parallel elements of the memory. In phase 1, the WL signal voltage initially floats as operating voltage VDD (as in phase 0). The SLs of all memory elements are brought to operating voltage VDD in phase 1. This provides near 100% capacitive coupling for transistor components of the memory elements, including memory elements to be programmed in the second programming phase and memory elements that are not to be programmed during the current memory operation. Thus, the WL (activation) signal voltage is boosted according to the inventive techniques from floating, at operating voltage VDD, to be approximately twice the operating voltage VDD (i.e., boosted by approximately a factor of two), and the anti-parallel memory elements are programmed. Because all SLs transition in the same way at the same time, decoding can be optimized for area rather than a traditional, selective boost ratio as used for memory element boosting selection. Additionally, no significant voltage stress for oxide components remains in phase 1 because the only overvoltage remaining in the memory system is due to the voltage drop from drain to source of the transistors for memory elements to be programmed as anti-parallel, and this stress may be minimal or negligible. In the second programming phase (phase 2), the WL signal voltage is again brought to operating voltage VDD, the SLs of all memory elements are brought to reference voltage VSS (preventing any stress on their memory elements), and the parallel data values are programmed.

Turning now to FIGS. 2A and 2B, circuit diagrams for programming configurations of memory elements according to embodiments herein are shown. In FIG. 2A, a memory element anti-parallel programming phase configuration 200A is shown. In embodiments, a memory component as described herein may include a transistor 202 and a resistive device 204 (e.g., a magnetic tunneling junction (MTJ) device). Transistor 202 may be any type of transistor, such as and but not limited to, bi-polar junction transistors (BJTs), field effect transistors (FETs) like metal oxide semiconductor FETs (MOSFETS), and/or the like. As exemplarily illustrated, transistor is an nMOS FET (though pMOS configurations are contemplated herein) having a gate, a source, and a drain, as would be understood by a person of skill in the relevant art(s) having the benefit of this disclosure. The gate of transistor 202 is coupled to an activation terminal 206, the drain of transistor 202 is coupled to a first terminal 208 (at the bit line (BL) node of the memory component) via resistive device 204, and the source of transistor 202 is coupled to a second terminal 210 (at the source line (SL) node of the memory component). Resistive device 204 is configured to provide a resistance for the memory element from which a programmed data value may be determined, as described above. For example, as shown in memory element anti-parallel programming phase configuration 200A, an operating voltage (VDD) is applied at second terminal 210, and a reference voltage (VSS) is applied at first terminal 208. When transistor 202 is activated by an activation signal, e.g., a memory write line (WL) signal, at activation terminal 206, a current 212 flows from the source to the drain of transistor 202 and through resistive device 204 causing an anti-parallel magnetic field configuration to be applied to resistive device 204. Accordingly, an anti-parallel data value is associated with the memory element anti-parallel programming phase configuration 200A. In accordance with the described techniques and embodiments, memory element anti-parallel programming phase configuration 200A may represent a first programming phase (i.e., phase 1).

As is described in further detail herein, during the first programming phase, a voltage boost to the activation signal provided to activation terminal 206 is performed. The voltage boost may be provided by memory elements that will be programmed during the second programming phase (phase 2), as described with respect to FIG. 2B, and by memory elements that will not be programmed during the current memory operation as these memory elements are transitioned from the setup phase (phase 0) to the first programming phase (phase 1). That is, in embodiments, the second terminals of all or a majority of the memory elements are brought to operating voltage VDD from reference voltage VSS in the first programming phase, and this provides the near 100% coupling for transistor components of the memory elements as described above.

In FIG. 2B, a memory element parallel programming phase configuration 200B is shown. As illustrated, memory element parallel programming phase configuration 200B may include the same memory element described above in FIG. 2A, but the voltages applied to first terminal 208 and to second terminal 210 may differ. For instance, as shown in memory element parallel programming phase configuration 200B, an operating voltage (VDD) is applied at first terminal 208, and a reference voltage (VSS) is applied at second terminal 210. When transistor 202 is activated by a signal, e.g., a memory write line (WL) signal, at activation terminal 206, a current 214 flows from resistive device 204 and through the drain to the source of transistor 202 causing a parallel magnetic field configuration to be applied to resistive device 204—this current flow is in the opposite direction of that shown in FIG. 2A. Accordingly, a parallel data value is associated with the memory element parallel programming phase configuration 200B. In accordance with the described techniques and embodiments, memory element parallel programming phase configuration 200B may represent a second programming phase (i.e., programming phase 2 or phase 2) that is subsequent to memory element anti-parallel programming phase configuration 200A (i.e., the first programming phase or phase 1).

As noted above, according to embodiments, memory devices and systems may include a plurality of memory elements. Such memory elements may be configured as the memory element shown in memory element anti-parallel programming phase configuration 200A and memory element parallel programming phase configuration 200B. Memory elements may be grouped together, e.g., in groups of four elements comprising a data word group, in memory devices and systems. Each memory element of a data word group may be programmed according to memory element shown in memory element anti-parallel programming phase configuration 200A and/or memory element parallel programming phase configuration 200B depending on the data word to be written into the memory device or system, as described in further detail herein.

Furthermore, in embodiments, a memory element, such as the memory element illustrated in memory element anti-parallel programming phase configuration 200A or in memory element parallel programming phase configuration 200B, may only be programmed once to a given value during a memory operation. That is, a memory element may only be programmed during the first programming phase or during the second programming phase.

In FIG. 3, a flowchart 300 is shown. Example embodiments described herein may be configured to perform two phase memory programming according to flowchart 300. For instance, memory element anti-parallel programming phase configuration 200A and memory element parallel programming phase configuration 200B, along with any respective components/subcomponents thereof, may be configured to perform two phase memory programming according to flowchart 300. Flowchart 300 is described as follows.

A memory element is programmed using anti-parallel fields to store a first data value during a first programming phase according to an activation voltage boost (302). For instance, a memory element of a memory device or system may be programmed according to memory element anti-parallel programming phase configuration 200A of FIG. 2A. That is, as noted above, an operating voltage (VDD) is applied at second terminal 210, and a reference voltage (VSS) is applied at first terminal 208. When transistor 202 is activated by a boosted activation signal at activation terminal 206, current 212 flows from the source to the drain of transistor 202 and through resistive device 204 causing an anti-parallel magnetic field configuration to be applied to resistive device 204. Such programming is performed in a first programming phase with the activation signal being boosted according to the techniques and embodiments described herein, where the voltage boost to the activation signal is provided by the transition of second terminals of memory elements from VSS to VDD in the first programming phase while floating the voltage at activation terminal 206 at operating voltage VDD. As would be understood, one or more additional memory elements may also be programmed using anti-parallel fields to store the first value therein during the first programming phase.

Another memory element is programmed using parallel fields to store a second data value during a second programming phase that is subsequent to the first programming phase (304). For instance, a memory element of a memory device or system other than the memory element of 302 may be programmed according to memory element parallel programming phase configuration 200B of FIG. 2B. That is, as noted above, an operating voltage (VDD) is applied at first terminal 208, and a reference voltage (VSS) is applied at second terminal 210. When transistor 202 is activated by an activation signal at activation terminal 206, a current 214 flows from resistive device 204 and through the drain to the source of transistor 202 causing a parallel magnetic field configuration to be applied to resistive device 204, where this current flow is in the opposite direction of that shown in FIG. 2A. Such programming is performed in the second programming phase where the activation signal may not be boosted. As would be understood, one or more additional memory elements may also be programmed using parallel fields to store the second value therein during the second programming phase.

In some example embodiments, one or more of operations 302 and/or 304 of flowchart 300 may not be performed. Moreover, operations in addition to or in lieu of operations 302 and/or 304 may be performed. Further, in some example embodiments, one or more of operations 302 and/or 304 may be performed out of order, in an alternate sequence, or partially (or completely) concurrently with each other or with other operations.

As described above, the two phase programming techniques and embodiments herein provide for the ability to boost the voltage of an activation signal (e.g., WL signal)

used to activate transistors of memory components in a non-traditional way during the first programming phase to overcome difficulties due to the dual polarity programming requirements of MRAM where one direction of current flow struggles to deliver sufficient current during anti-parallel programming (e.g., across transistor 202 from source to drain, as shown in FIG. 2A).

The techniques and embodiments described herein provide for improvements in memory devices and systems as described above, including but not limited to MRAM devices and systems.

For instance, methods, systems, devices, and apparatuses are provided for improved memory systems. A memory device in accordance with an example aspect is described. The memory device includes a plurality of memory elements configured to store data. The memory device also includes programming configuration logic configured to program each of the memory elements to a first data value during a first programming phase or a second data value during a second programming phase that is subsequent to the first programming phase. A first memory element of the plurality of memory elements includes first and second terminals configured to receive a first voltage or a second voltage according to the programming configuration logic.

A method performed in a memory device in accordance with another example aspect is described. The method includes receiving a reference voltage at a first terminal and an operating voltage at an activation terminal of a first memory element of the memory device during a setup phase. During a first programming phase, the method also includes transitioning a second terminal of the first memory element and a second terminal of a second memory element of the memory device from the reference voltage to the operating voltage to increase the operating voltage at the activation terminal of the first memory element, and programming a first data value at the first memory element.

A memory device in accordance with yet another example aspect is also described. The memory device includes a first set of memory elements, a second set of memory elements, a third set of memory elements, and programming configuration logic. The first set of memory elements are configured to be programmed with a first data value during a first programming phase. The second set of memory elements are configured to be programmed with a second data value during a second programming phase that is subsequent to the first programming phase. The third set of memory elements comprise memory elements configured to not be programmed during the first programming phase and the second programming phase. Each memory element of the first set, the second set, and the third set have a respective first terminal, a respective second terminal, and a respective activation terminal. The programming configuration logic is configured to enable an operating voltage to be received by first terminals of the memory elements of the second set and by activation terminals of the memory elements of the first set, of the second set, and of the third set, and enable a reference voltage to be received by first terminals of the memory elements of the first set and of the third set and by second terminals of the first set, of the second set, and of the third set during a setup phase that is prior to the first programming phase. During the first programming phase, the program configuration logic is configured to enable the activation terminals of the memory elements of the first set, of the second set, and of the third set to initially float at the operating voltage, and to enable the operating voltage to be received by the first terminals of the memory elements of the second set and of the third set, and by the second terminals of the memory elements of the first set, of the second set, and of the third set to add a boost voltage to the operating voltage at the activation terminals of the first set, the second set, and the third set. The boost voltage is approximately twice the initially floated operating voltage.

Various example embodiments are described in the following subsections. In particular, example memory device and memory element embodiments are described. This description is followed by further example embodiments and advantages are described, and subsequently an example computer implementation is described. Finally, some concluding remarks are provided. It is noted that the division of the following description generally into subsections is provided for ease of illustration, and it is to be understood that any type of embodiment may be described in any subsection.

III. Example Memory Device and Memory Element Embodiments

As noted above, memory systems and devices, such as MRAM systems and devices, along with their components such as memory elements and programming configuration logic, may be configured in various ways to provide two phase programming with non-traditional boosting, and to improve memory device area requirements, reliability, cost, and decoding complexity. Techniques and embodiments are provided for implementation in and with devices and systems that utilize memories such as MRAMs. For instance, in embodiments, an MRAM device comprised of MRAM elements (memory elements) according to the described techniques and embodiments may be implemented in devices and systems such as those enumerated herein.

In embodiments, by way of illustrative example and not limitation, a memory device or system comprises a plurality of memory elements that are configured to store parallel and anti-parallel data values in different programming phases. According to the described techniques, the anti-parallel data values are programmed into the memory elements in a first programming phase using voltage boosting according to the techniques described herein. A memory device or system may comprise two or more (e.g., up to 'N') memory elements. These memory elements may comprise resistive devices/components on which data may be programmed during memory write operations. The programming of the memory elements is performed by programming configuration logic, according to embodiments. For example, according the described techniques, programming configuration logic may provide different voltages to terminals of the memory elements during phases of memory operations, e.g., a setup phase, a first programming phase for anti-parallel data values, and a second programming phase for parallel data values. The application of these voltages enables the memory elements to activate, receive activation voltages boosts, and be programmed with the different data values.

Systems and devices, such as memory devices and their respective components, as well as MRAM systems and components, may be configured in various ways to include programming configuration logic that performs functions according to the techniques and embodiments described herein.

FIG. 4 shows a block diagram of an example memory device configuration 400 for implementing the above-referenced improvements. Memory device configuration 400 may include a memory device 402 that comprises a plurality of instances of memory elements in memory elements 404 and programming configuration logic 406. Memory device 402 may be an MRAM device, according to embodiments.

Memory elements 404 and programming configuration logic 406 may be communicatively and/or electrically coupled by one or more connectors 408. Memory device 402 may receive memory inputs on input connector 410, and may provide memory outputs on output connector 412.

Memory elements 404 may comprise two or more memory elements. Each memory element may be a further embodiment of memory element anti-parallel programming phase configuration 200A of FIG. 2A and memory element parallel programming phase configuration 200B of FIG. 2B. Each memory element of memory elements 404 may be configured to store a data bit, e.g., a '0' or a '1', either of which may be anti-parallel data value or a parallel data value according to implementation. In embodiments, memory elements 404 may comprise groups of memory elements, such as but not limited to, groups of four elements that comprise word groups (i.e., a group of memory elements that is configured to store or be programmed with four data bits), and/or banks comprising multiple word groups. As referenced herein, memory elements 404 may refer to a memory element, a word group, a bank, and/or multiple instances of these designators.

As illustrated in FIGS. 2A and 2B and described above, each memory element of memory elements 404 may comprise a transistor and resistive device, e.g., an MTJ device, to which an operating voltage and a reference voltage may be applied for activation and programming. Each memory element of memory elements 404 is configured to receive the operating voltage and the reference voltage according to programming configuration logic 406, as described herein.

Programming configuration logic 406 is configured to program data values into memory elements 404 and/or word groups of memory elements 404. Programming configuration logic 406 may comprise logic configured to track memory states of memory device 402 such as a state machine(s), a linear delay chain(s), and/or the like, as well as selector logic for enabling an operating voltage (VDD) and a reference voltage (VSS) to be provided to specific terminals of memory elements 404, as described in further detail herein. The logic configured to track memory states of memory device 402 may comprise hardware elements or hardware elements combined with one or both of software and firmware. Programming configuration logic 406 may also comprise a decoder or decoding logic that may be configured to determine which of memory elements 404 are to programmed with parallel and/or anti-parallel data values based on decoding memory inputs received on input connector 410 and the memory state. Programming configuration logic 406 is configured to transition the provided voltages between operational phases. For example, an initial setup phase may be configured, followed by a transition to a first programming phase (e.g., for anti-parallel data values), which may be followed by a second programming phase (e.g., for parallel data values). According to embodiments, programming configuration logic 406 may be configured to enable the transition between the setup phase, the first programming phase, and the second programming phase according to a phase state that is based on a state machine, a linear delay chain, and/or the like. Exemplary phase transitions are illustrated in phase chart 600 of FIG. 6. As shown, during the transition from the setup phase to the first programming phase, programming configuration logic 406 may be configured to change the voltages provided to memory elements 404 in order to generate a voltage boost applied to activation terminals of memory elements 404. In some embodiments, during the second programming phase, programming configuration logic 406 may be configured to perform an optional selective boost.

In embodiments, programming configuration logic 406 may be configured to provide the operating voltage and the reference voltage to memory elements 404 via connectors 408. In other embodiments, programming configuration logic 406 may be configured to provide configuration or programming signals output by selector logic via connectors 408 to one or more components that enable operating voltage VDD and reference voltage VSS to be provided to and received by memory elements 404. Connectors 408 may also be configured as inputs to programming configuration logic 406 on which data values programmed in memory components 404 are read and subsequently output by memory device 402 via output connector 412.

In FIG. 5 a flowchart 500 is shown. Example embodiments described herein may be configured to perform two phase memory programming according to flowchart 500. For instance, memory element anti-parallel programming phase configuration 200A of FIG. 2A and memory element parallel programming phase configuration 200B of FIG. 2B, and memory device 402 of FIG. 4, along with any respective components/subcomponents thereof, may be configured to perform two phase memory programming with voltage boosting according to flowchart 500. Flowchart 500 is described as follows.

A first voltage configuration is enabled to be received by memory elements for a setup phase of a memory operation (502). For instance, programming configuration logic 406 enables a voltage configuration to be received by memory elements 404 in accordance with the setup phase (phase 0) of phase chart 600 of FIG. 6. This voltage configuration includes enabling an operating voltage VDD to be received by bit line (BL) terminals of memory elements 404 that are to be programmed with parallel data values, and enabling a reference voltage VSS to be received by BL terminals of memory elements 404 that are to be programmed with anti-parallel data values. The voltages enabled to be applied to BL terminals of memory elements 404 to be programmed may remain unchanged during the described memory operation. The voltage configuration for the setup phase includes enabling reference voltage VSS to be received by all BL terminals and SL terminals of memory elements 404 that are not to be programmed during a given memory operation (i.e., unused and deselected memory elements 404). The voltage configuration for the setup phase also includes enabling operating voltage VDD to be received by WL terminals (activation terminals) of memory elements 404.

A second voltage configuration is enabled to be received by the memory elements for a first programming phase of the memory operation in which a voltage boost is provided (504). For example, programming configuration logic 406 enables a voltage configuration to be received by memory elements 404 in accordance with the first programming phase (phase 1) of phase chart 600 of FIG. 6. The voltage configuration for the first programming phase includes enabling operating voltage VDD to float at WL terminals (activation terminals) of memory elements 404. This voltage configuration also includes enabling operating voltage VDD to be received by BL terminals of memory elements 404 that are not to be programmed during a given memory operation (i.e., unused and deselected memory elements 404) and to be received by SL terminals of all or a majority of memory elements 404. Accordingly, a voltage boost is provided (i.e., added) at WL terminals (activation terminals) of memory elements 404. This voltage boost may be of a value such that the voltage at the WL terminals (activation terminals) of memory elements 404 is approximately twice the initial operating voltage VDD after the voltage boost is provided. The provided voltage boost enables anti-parallel programming with sufficient current through programmed memory elements 404 from SL terminals to BL terminals to allow for smaller components to be used for memory elements 404 (e.g., smaller transistors as described herein) and to introduce significantly less to no oxide stress for such components in contrast to prior solutions.

One or more memory elements other than memory elements programmed in the first and second programming phases may be selected to perform a selective voltage boost to a programming activation input (506). For example, programming configuration logic 406 may select, e.g., using a decoder or decoding logic, one or more elements of memory elements 404 that are not to be programmed to provide the selective boost subsequent to the first programming phase in accordance with the second programming phase (phase 2) of phase chart 600 of FIG. 6. That is, programming configuration logic 406 may enable selected memory components 404 to receive operating voltage VDD at their respective BL and SL terminals while having the WL terminals (activation terminals) of memory elements 404 float at operating voltage VDD, in order to provide the selective boost. In embodiments, 506 is an optional operation.

A third voltage configuration is enabled to be received by the memory elements for a second programming phase of the memory operation that is subsequent to the first programming phase (508). For example, programming configuration logic 406 enables a voltage configuration to be received by memory elements 404 in accordance with the second programming phase (2) of phase chart 600 of FIG. 6. The voltage configuration for the second programming phase includes enabling operating voltage VDD to be received by WL terminals (activation terminals) of memory elements 404 (although if 506 is performed, this voltage may float). This voltage configuration also includes enabling reference voltage VSS to be received by BL terminals of memory elements 404 that are not to be programmed during a given memory operation (i.e., unused and deselected memory elements 404) and to be received by SL terminals of all or a majority of memory elements 404. Accordingly, parallel data values are enabled to be programmed.

In some example embodiments, one or more of operations 502, 504, 506, and/or 508 of flowchart 500 may not be performed. Moreover, operations in addition to or in lieu of operations 502, 504, 506, and/or 508 may be performed. Further, in some example embodiments, one or more of operations 502, 504, 506, and/or 508 may be performed out of order, in an alternate sequence, or partially (or completely) concurrently with each other or with other operations.

Turning now to FIG. 7, a circuit diagram of an example memory device 700 for implementing the above-referenced improvements is shown. Memory device 700 may be a further embodiment of memory device 402 of FIG. 4, and may be an MRAM device in embodiments. Memory device 700 may include a plurality of instances of memory elements and programming configuration logic 716. The memory elements of memory device 700 may be further embodiments of memory element anti-parallel programming phase configuration 200A of FIG. 2A, of memory element parallel programming phase configuration 200B of FIG. 2B, and/or of memory elements 404 of FIG. 4. Programming configuration logic 716 may be a further embodiment of programming configuration logic 406 of FIG. 4. Memory device 700 is configured to operate according to flowchart 300 of FIG. 3 and flowchart 500 of FIG. 5 according to embodiments. Memory device 700 is described as follows.

As illustrated in FIG. 7, memory elements comprise a transistor, a resistive device, a first terminal, a second terminal, and an activation terminal. For instance, a memory element 702a includes a transistor 706a, a resistive device 708a, a first terminal 710a, a second terminal 712a, and an activation terminal 714. Similarly, a memory element 702b includes a transistor 706e, a resistive device 708e, a first terminal 710e, a second terminal 712b, and activation terminal 714. In memory device 700, twelve memory elements are illustrated, although fewer or additional memory elements are contemplated for memory devices according to the described techniques and embodiments. As shown, each memory element is not individually designated in FIG. 7 for illustrative clarity, but are described below.

The memory elements of memory device 700 are configured into three word groups 704a-704c that each comprise four memory elements (i.e., 4-bit words), although fewer or additional memory word groups and fewer or additional memory elements per group are contemplated for memory devices according to the described techniques and embodiments. Banks comprising multiple word groups are also contemplated herein. Word groups 704a-704c may comprise a bank, in embodiments. Each memory component comprises a respective transistor 706a-706l, a respective resistive device 708a-708l that is electrically coupled at a first end to the drains of corresponding transistors 706a-706l, and a respective first terminal 710a-710l that is electrically coupled at a second end of corresponding respective resistive devices 708a-708l. The memory elements of word group 704a each comprise a second terminal 712a that is electrically coupled to the source of transistors 706a-706d. The memory elements of word group 704b each comprise a second terminal 712b that is electrically coupled to the source of transistors 706e-706h. The memory elements of word group 704c each comprise a second terminal 712c that is electrically coupled to the source of transistors 706i-706l. Each memory element of word groups 704a-704c also includes activation terminal 714 that is electrically coupled to the gates of transistors 706a-706l.

Memory elements of memory device 700 may be programmed, unused, or deselected during a given memory operation. Memory elements to be programmed may be programmed with anti-parallel data values during a first programming phase, or may be programmed with parallel data values during a second programming phase, according to the described techniques. Unused memory elements are memory elements in a word group that does not include a memory element to be programmed during a given memory operation. Unselected memory elements are memory elements in a word group that are not to be programmed during a given memory operation, but where the word group includes another memory element to be programmed. Memory elements to be programmed with parallel data values during the second programming phase, unused memory elements, and unselected memory elements are available to provide a voltage boost in accordance with the techniques described herein.

Further details for programming memory elements in memory devices are provided below. Additionally, it is contemplated herein that multiple banks (e.g., such as a bank including word groups 704a-704c) may be included in embodiments, but are not shown for the sake of brevity.

Transistors 706a-706l are illustrated as nMOS FETs, however it should be noted that in embodiments, configurations comprising other types of transistors, e.g., pMOS FETs, etc., are contemplated as would be understood by a person of skill in the relevant art(s) having the benefit of this disclosure. Transistors 706a-706l are configured to be activated when memory elements are programmed with data values during memory write operations. According to the techniques and embodiments described herein, the size of transistors 706a-706l are smaller than prior solutions for memory devices such as MRAM devices based in part on the capability of the memory devices described herein to perform programming of anti-parallel data values with a voltage boost and parallel data values in different programming phases.

Resistive devices 708a-708l may be MTJ devices or any other resistive device in which resistance varies based on a current(s) and/or a magnetic field(s) applied. In embodiments, resistive devices 708a-708l are MTJ devices that have varying resistances based on applied magnetic fields. For example, as similarly described above with respect to FIG. 2A, when a current traverses a memory element from its transistor and through its resistive device (e.g., an MTJ device), anti-parallel magnetic fields are applied to the memory element. The anti-parallel magnetic fields applied result in a first resistance of the resistive device that corresponds to a first data value. The first data value may be read or determined from the resistive device by applying a relatively small additional current to the resistive device and measuring the corresponding voltage drop across the resistive device. In the context of FIG. 7, a memory element, e.g., memory element 702a, may have a current traverse from second terminal 712a through transistor 706a and then resistive device 708a to first terminal 710a by receiving an operating voltage (VDD) at second terminal 712a and receiving a reference voltage (VSS) at first terminal 710a when an activation signal (e.g., VDD or higher) is received at activation input 714. That is, the transistor is activated and current flows as described generating anti-parallel magnetic fields that are applied to resistive device 708a. Memory element 702b may be similarly configured and operationally capable for parallel data value programming. The sources of the operating voltage (VDD) and the reference voltage (VSS) are described in further detail below.

In contrast, as similarly described above with respect to FIG. 2B, when a current traverses a memory element from its resistive device (e.g., MTJ device) and through its transistor, parallel magnetic fields are applied to the memory element. The parallel magnetic fields applied result in a second resistance of the resistive device that corresponds to a second data value. The second data value may be read or determined from the resistive device by applying a relatively small additional current to the resistive device and measuring the corresponding voltage drop across the resistive device. In the context of FIG. 7, a memory element, e.g., memory element 702a, may have a current traverse from first terminal 710a through resistive device 708a and then transistor 706a to second terminal 712a by receiving a reference voltage (VSS) at second terminal 712a and receiving an operating voltage (VDD) at first terminal 710a when an activation signal (e.g., VDD or higher) is received at activation input 714. That is, the transistor is activated and current flows as described generating parallel magnetic fields that are applied to resistive device 708a. Memory element 702b may be similarly configured and operationally capable for parallel data value programming.

It should also be noted that each other memory element of memory device 700 of FIG. 7 may be configured accordingly in to embodiments.

First terminals 710a-710l may represent bit line (BL) nodes of the memory components of memory device 700 and are configured to receive operating and reference voltage according to programming configuration logic 716. Second terminals 712a-712c may represent source line (SL) nodes of the memory components of memory device 700 and are configured to receive operating and reference voltage according to programming configuration logic 716. Activation terminal 714 may represent a write line (WL) node of the memory components of memory device 700 and is configured to receive an operating voltage or a boosted operating voltage according to programming configuration logic 716.

As shown in FIG. 7, programming configuration logic 716 includes a state tracker 718 and a decoder 720. Programming configuration logic 716 is configured to receive memory inputs from requesting devices, e.g., for memory read and/or write operations, via input connector 722. In embodiments, programming configuration logic 716 may be configured to provide memory outputs to be transmitted to the requesting devices, e.g., for memory read and/or write operations, via output connector 724.

State tracker 718 is configured to track a memory state of memory device 700 for memory operations, such as memory write operations. State tracker 718 may be a state machine, a linear delay chain, and/or the like, according to embodiments. State tracker 718 is configured to track phases of operation such as the initial setup phase, the first programming phase, and the second programming phase, as described herein. State tracker 718 may be configured to determine when states begin, transition, and/or end during memory operations. In embodiments, state tracker 718 may be configured to track which memory elements of memory device 700 are to be programmed during the first and second programming phases a memory operation and Decoder 720 is configured to decode received memory inputs and determine which memory elements of word groups 704a-704c will be programmed during the corresponding memory operation. Decoder 720 may be configured to make such a determination based on decoding, e.g., a memory write address and memory write data from memory inputs received via input connector 722. Decoder 720 also determines if the memory elements are to be programmed with anti-parallel data values during a first programming phase or with parallel data values during a second programming phase. Similarly, decoder 720 is configured to determine which memory elements of word groups 704a-704c will be unselected and unused. Based on these determinations, programming configuration logic 716 enables the memory elements of word groups 704a-704c to receive operating and reference voltages at their terminals that correspond to the memory operation during operation phases according to the memory state tracked by state tracker 718.

State tracker 718 and decoder 720 may be configured as a single component, and may comprise hardware, or hardware combined with one or both of software and firmware, in embodiments.

Programming configuration logic 716 includes an operating voltage selection connector 726, a reference voltage selection connector 728, an activation selection connector 730, and a data value connector 732. Operating voltage selection connector 726, reference voltage selection connector 728, activation selection connector 730, and/or data value connector 732 are configured, in embodiments, to provide their respective signals described below according to state tracker 718 and decoder 720 described above, and may be a further embodiment of one or more connectors 408 of FIG. 4.

Operating voltage selection connector 726 is configured to provide an operating voltage selection signal to enable first terminals 710a-710l (i.e., BL nodes), second terminals 712a-712c (i.e., SL nodes), and activation terminal 714 to receive an operating voltage (VDD) in embodiments.

Reference voltage selection connector 728 is configured to provide an activation selection signal to enable first terminals 710a-710l (i.e., BL nodes), second terminals 712a-712c (i.e., SL nodes), and activation terminal 714 to receive a reference voltage (VSS) in embodiments.

Activation selection connector 730 is configured to provide an activation selection signal to enable activation connector 714 to receive an activation signal (e.g., WL signal).

Data value connector 732 may comprise multiple connectors in embodiments. Programming configuration logic 716 is configured to determine whether anti-parallel or parallel data values are stored in memory elements (e.g., 702a, 702b, etc.) of memory device 700 via data value connector 732. For example, programming configuration logic 716 may provide a relatively small current to a memory element and receive an indication of a voltage drop across a resistive device (e.g., resistive devices 708a-708l) via data value connector 732. Based on the voltage drop, programming configuration logic 716 determines whether an anti-parallel or a parallel data value is stored in a memory element.

In embodiments, one or more of operating voltage selection connector 726, reference voltage selection connector 728, activation selection connector 730, and/or data value connector 732 may be combined. For instance, operating voltage selection connector 726 and reference voltage selection connector 728 may be combined as a single connector such that a first value of a signal on the combined connector corresponds to an operating voltage being received by terminals of memory device 700, while a second value of a signal on the combined connector corresponds to a reference voltage being received by terminals of memory device 700. It should further be noted that one or more of operating voltage selection connector 726, reference voltage selection connector 728, activation selection connector 730, and/or data value connector 732 may be included in memory device 700, according to embodiments. That is, each connector as shown may represent a plurality of connectors, such as but not limited to, a corresponding connector for each terminal and/or resistive device of memory device 700. According to embodiments, operating voltage selection connector 726, reference voltage selection connector 728, activation selection connector 730, and/or data value connector 732 may be electrically coupled to selectors such as multiplexors or logic (not shown for illustrative clarity) that correspond to the described terminals of FIG. 7 and are utilized in enabling the terminals and resistive devices of memory elements to receive the selected voltages. These selectors may be positioned in an electrical path between voltage sources (e.g., VDD/VSS) and the terminals/resistive devices enabled to receive the voltages, or may be included within programming configuration logic 716 in embodiments. In configurations where the selectors are included within programming configuration logic 716, operating voltage selection connector 726, reference voltage selection connector 728, activation selection connector 730, and/or data value connector 732 may be configured as signal providers that provide the described voltages to the terminals and resistive devices enabled to receive them.

Memory device 700 also comprises an operating voltage connector 734 that is electrically coupled to an operating voltage (e.g., VDD), and a reference voltage connector 736 that is electrically coupled to a reference voltage (e.g., VSS). Operating voltage connector 734 and reference voltage connector 736 are configured to provide their respective coupled voltages to first terminals 710a-710l, to second terminals 712a-712c, and to activation terminal 714 of the memory component of memory device 700 when the memory components are enabled, by configuration logic 716, to receive the voltages as described herein. In embodiments, operating voltage connector 734 and reference voltage connector 736 may be included in configuration logic 716.

Table 1, shown below, provides an illustration of example memory element terminal values by phase, as described above with respect to FIG. 7. In Table 1, 'WL' corresponds to a WL node voltage value at activation terminal 714. 'BL (unused and undetected)' corresponds to BL nodes at first terminals 710a-710l that are not to be programmed, 'BL anti-parallel data value' corresponds to BL nodes at first terminals 710a-710l that are to be programmed with anti-parallel data values during the first programming phase (anti-parallel programming phase 1), and 'BL parallel data value' corresponds to BL nodes at first terminals 710a-710l that are to be programmed with parallel data values during the second programming phase (parallel programming phase 2). 'SL' corresponds to SL nodes at second terminals 712a-712c.

TABLE 1

Terminal Values by Phase

| | Setup phase 0 | Anti-parallel programming phase 1 | Parallel programming phase 2 |
|---|---|---|---|
| WL | VDD | VDD float | VDD |
| BL (unused and deselected) | VSS | VDD | VSS |
| BL anti-parallel data value | VSS | VSS | VSS |
| BL parallel data value | VDD | VDD | VDD |
| SL | VSS | VDD | VSS |

The embodiments and techniques described above, e.g., in FIG. 7 and Table 1, are further detailed in an example memory write operation illustrated in FIGS. 8 and 9 as described below.

For example, in an example memory write operation with respect to memory device 700 of FIG. 7, a memory address may specify that the first memory element of word group 704a be programmed and the memory data may specify that a parallel data value be programmed during the memory write operation. The memory address may further specify that the first memory element of word group 704b be programmed and the memory data may further specify that an anti-parallel data value be programmed during the memory write operation. That is, memory element 702a is the target of the memory write operation for the parallel data value, and memory element 702b is the target of the memory write operation for the anti-parallel data value. Accordingly, and with reference to FIG. 7, memory elements of word group 704c are unused, and memory elements of word groups 704a-704b other than memory elements 702a-702b are unselected.

Figure 8:
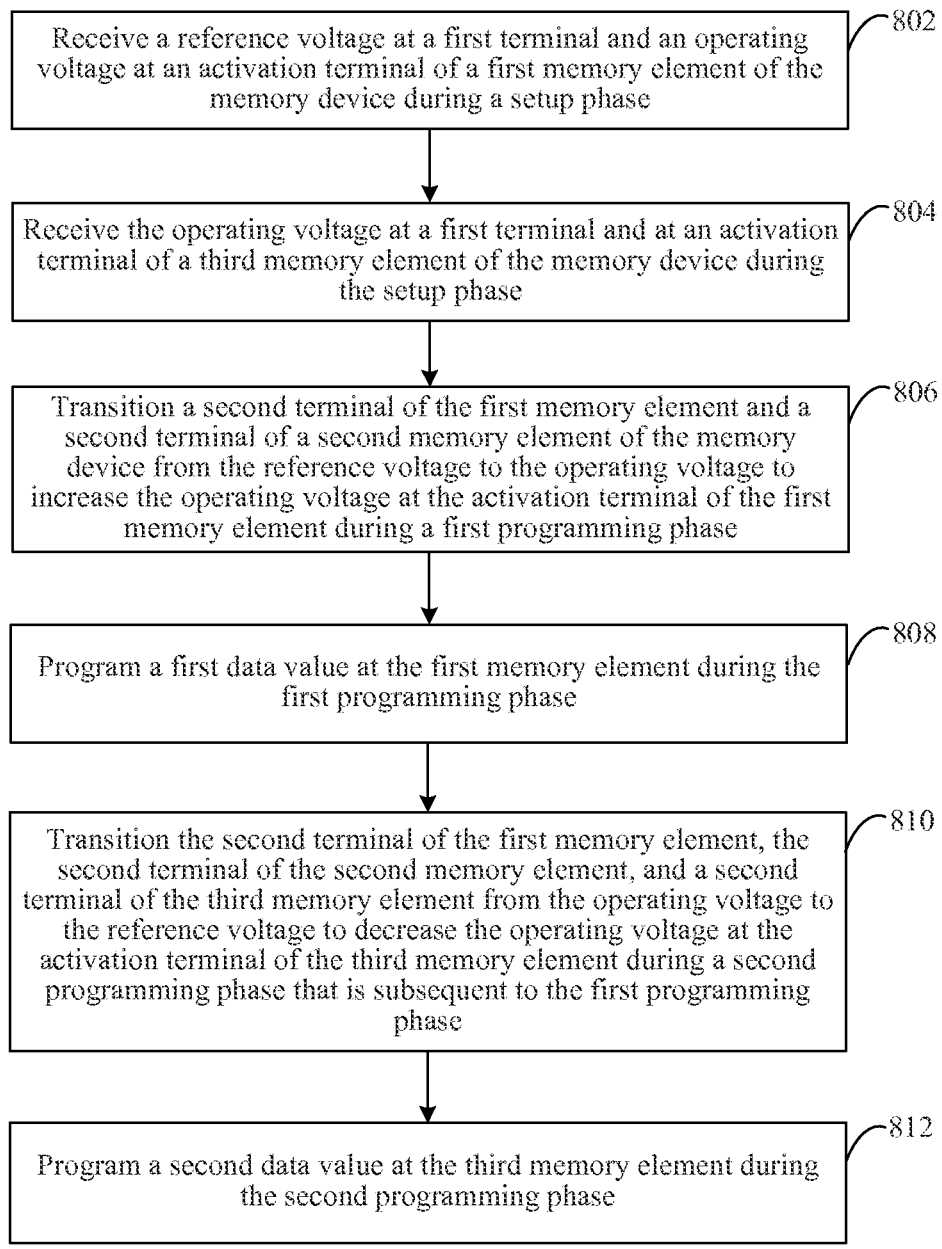
FIG. 8 shows a flowchart for programming phases of memory elements that use a two phase boost, according to an example embodiment.

FIG. 8 is described with respect to the example memory write operation above for illustrative reference and not by way of limitation.

Turning now to FIG. 8, a flowchart 800 is shown. Example embodiments described herein may be configured to perform two phase boosting to program anti-parallel data values during a first programming phase and to program parallel data values during a second programming phase that is subsequent to the first programming phase according to flowchart 800. For instance, memory element anti-parallel programming phase configuration 200A of FIG. 2A, memory element parallel programming phase configuration 200B of FIG. 2B, memory device 402 of FIG. 4, and/or memory device 700 of FIG. 7, along with any respective components/subcomponents thereof, may be configured to perform two phase boosting to program anti-parallel data values during a first programming phase and to program parallel data values during a second programming phase that is subsequent to the first programming phase according to flowchart 800. Flowchart 800 is described as follows.

A reference voltage is received at a first terminal and an operating voltage is received at an activation terminal of a first memory element of the memory device during a setup phase (802). For instance, with respect to the example memory write operation above, reference voltage VSS is received, via reference voltage connector 736, by first terminal 710e of memory element 702b, and operating voltage VDD is received, via operating voltage connector 734, by activation terminal 714 of memory element 702b, during the initial setup phase (setup phase 0 of Table 1) before the first programming phase. In embodiments, second terminal 712b of memory element 702b may receive reference voltage VSS, via reference voltage connector 736, during the initial setup phase. The operating voltage VDD and the reference voltage VSS may be provided and enabled to be received according the operation of programming configuration logic 716 described herein.

The operating voltage is received at a first terminal and at an activation terminal of a third memory element of the memory device during the setup phase (804). For instance, with respect to the described example memory write operation, operating voltage VDD is received, via operating voltage connector 734, by first terminal 710a and by activation terminal 714 of memory element 702a, during the initial setup phase before the first programming phase. In embodiments, second terminal 712a of memory element 702a may receive reference voltage VSS, via reference voltage connector 736, during the initial setup phase. The operating voltage VDD and the reference voltage VSS may be provided and enabled to be received according the operation of programming configuration logic 716 described herein.

It should be noted that, in embodiments, any or all of second terminals 712a-712c may receive reference voltage VSS, via reference voltage connector 736, during the initial setup phase as described herein, e.g., in Table 1 above.

A second terminal of the first memory element and a second terminal of a second memory element of the memory device are transitioned from the reference voltage to the operating voltage to increase the operating voltage at the activation terminal of the first memory element during a first programming phase (806). For instance, with respect to the described example memory write operation, operating voltage VDD is received by second terminal 712a of memory element 702a via operating voltage connector 734 during the first programming phase (anti-parallel programming phase 1 of Table 1). Additionally, operating voltage VDD is received by one or more of second terminals 712b-712c and thus each memory element of memory device 700 is enabled to receive operating voltage VDD via corresponding second terminals 712a-712c. One or more of the memory elements other than memory element 702b may correspond to the second memory element of 806. As noted above, one or more of second terminals 712a-712c may be set to reference voltage VSS in the initial setup phase, thus when provided with operating voltage VDD, a transition from VSS to VDD takes place during the first programming phase. This provides for one or more transitioning memory elements, excluding memory element 702b, to simultaneously provide a voltage boost, as described herein, at activation terminal 714 that increases the voltage thereon. In embodiments, when each memory element, other than memory element 702b in this example, is configured to provide the boost voltage, the operating voltage applied at activation terminal 714 may be twice that of the normal VDD value. In embodiments, when the boost voltage is generated, activation terminal 714 may initially float at operating voltage VDD during the second programming phase. The operating voltage VDD and the reference voltage VSS may be provided and enabled to be received according the operation of programming configuration logic 716 described herein.

A first data value is programmed at the first memory element during the first programming phase (808). For instance, in the example memory operation, the voltage boost described in 806 allows for a sufficient voltage at activation terminal 714 to activate transistor 706e of memory element 702b when first terminal 710e is at reference voltage VSS and second terminal 712b is at operating voltage VDD in the first programming phase. Accordingly, a current may flow through transistor 706e and resistive device 708e from second terminal 712b to first terminal 710e (i.e., from VDD to VSS). This current flow creates an anti-parallel magnetic field that is applied to resistive device 708e resulting in a first resistance value, and thus memory element 702b is programmed with the first data value that corresponds to an anti-parallel value.

The second terminal of the first memory element, the second terminal of the second memory element, and a second terminal of the third memory element are transitioned from the operating voltage to the reference voltage to decrease the operating voltage at the activation terminal of the third memory element during a second programming phase that is subsequent to the first programming phase (810). For instance, with respect to the described example memory write operation, second terminals 712a-712c are transitioned from operating voltage VDD (as resulting in 806 above) to reference voltage VSS during the second programming phase (parallel programming phase 2), and therefore each memory element of memory device 700 has its corresponding second terminal 712a-712c at reference voltage VSS. Additionally, the operating voltage VDD is again applied and received at activation terminal 714. This voltage configuration results in a decrease of the voltage at activation terminal 714 from the boosted voltage (as in 806). The operating voltage VDD and the reference voltage VSS may be provided and enabled to be received according the operation of programming configuration logic 716 described herein.

A second data value is programmed at the third memory element during the second programming phase (812). For instance, in the example memory operation, the decreased voltage described in 810 allows for a sufficient voltage at activation terminal 714 to activate transistor 706*a* of memory element 702*a* when first terminal 710*a* is at operating voltage VDD and second terminal 712*a* is at reference voltage VSS in the second programming phase. Accordingly, a current may flow through resistive device 708*a* and transistor 706*a* from first terminal 710*a* to second terminal 712*a* (i.e., from VDD to VSS). This current flow creates a parallel magnetic field that is applied to resistive device 708*a* resulting in a second resistance value, and thus memory element 702*a* is programmed with the second data value that corresponds to a parallel value.

In some example embodiments, one or more of operations 802, 804, 806, 808, 810, and/or 812 of flowchart 800 may not be performed. Moreover, operations in addition to or in lieu of operations 802, 804, 806, 808, 810, and/or 812 may be performed. Further, in some example embodiments, one or more of operations 802, 804, 806, 808, 810, and/or 812 may be performed out of order, in an alternate sequence, or partially (or completely) concurrently with each other or with other operations.

Figure 9:
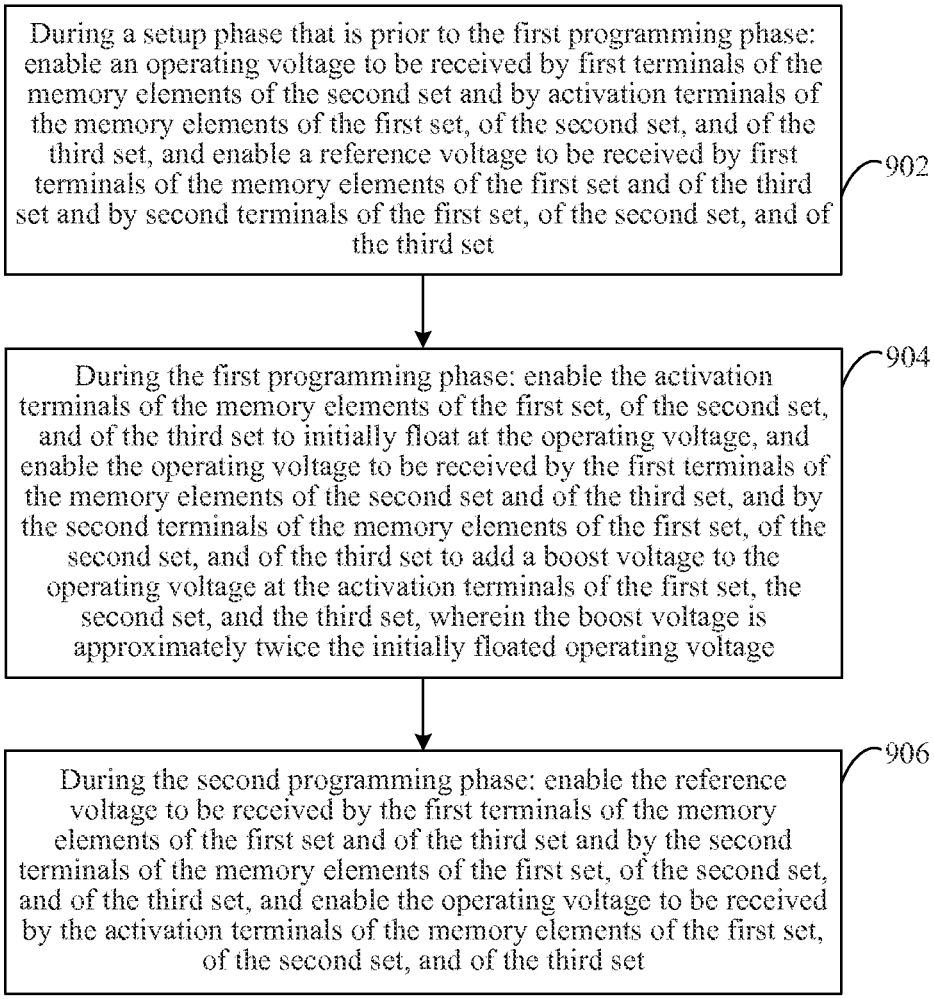
FIG. 9 shows a flowchart for programming phases of memory elements that use a two phase boost, according to an example embodiment.

FIG. 9 is also described with respect to the example memory write operation above for illustrative reference and not by way of limitation.

FIG. 9 shows a flowchart 900. Example embodiments described herein may be configured to perform two phase boosting to program anti-parallel data values during a first programming phase and to program parallel data values during a second programming phase that is subsequent to the first programming phase according to flowchart 900. For instance, memory element anti-parallel programming phase configuration 200A of FIG. 2A, memory element parallel programming phase configuration 200B of FIG. 2B, memory device 402 of FIG. 4, and/or memory device 700 of FIG. 7, along with any respective components/subcomponents thereof, may be configured to perform two phase boosting to program anti-parallel data values during a first programming phase and to program parallel data values during a second programming phase that is subsequent to the first programming phase according to flowchart 900. Flowchart 900 is described as follows.

In furtherance of the example memory write operation described above, a first set of memory elements is configured to be programmed with a first data value during a first programming phase. A second set of memory elements is configured to be programmed with a second data value during a second programming phase that is subsequent to the first programming phase. A third set of memory elements comprises memory elements configured to not be programmed during the first programming phase and the second programming phase.

During a setup phase that is prior to the first programming phase, an operating voltage is enabled to be received by first terminals of the memory elements of the second set and by activation terminals of the memory elements of the first set, of the second set, and of the third set, and a reference voltage is enabled to be received by first terminals of the memory elements of the first set and of the third set and by second terminals of the first set, of the second set, and of the third set (902). For instance, according to the memory write example, during an initial setup phase (e.g., setup phase 0 of Table 1) a second set of one or more memory elements of memory device 700, e.g., including memory element 702*a*, are enabled to receive operating voltage VDD at corresponding first terminals, e.g., first terminal 710*a* of memory element 702*a* and any of first terminals 710*b*-710*l* that correspond to memory elements of the second set to be programmed with parallel data values in the first programming phase (e.g., parallel programming phase 2 of Table 1). Additionally, activation terminal 714 is configured to receive operating voltage VDD. Reference voltage VSS is received by first terminals 710*b*-710*l* that are not associated with memory elements in the second set (e.g., by first terminal 710*e* of memory element 702*b* and first terminals 710*b*-710*d* and 710*f*-710*l* of any other memory elements of memory device 700 to be programmed with anti-parallel data values in the second programming phase (e.g., anti-parallel programming phase 1 of Table 1)), and by second terminals 712*a*-712*c*. The operating voltage VDD and the reference voltage VSS may be provided and enabled to be received according the operation of programming configuration logic 716 described herein.

During the first programming phase, the activation terminals of the memory elements of the first set, of the second set, and of the third set are enabled to initially float at the operating voltage, and the operating voltage is enabled to be received by the first terminals of the memory elements of the second set and of the third set, and by the second terminals of the memory elements of the first set, of the second set, and of the third set to add a boost voltage to the operating voltage at the activation terminals of the first set, the second set, and the third set, wherein the boost voltage is approximately twice the initially floated operating voltage (904). For instance, in the example memory operation, activation terminal 714 is enabled to initially float at operating voltage VDD during the first programming phase. In embodiments, floating the voltage at activation terminal 714 may comprise ceasing to drive or apply operating voltage VDD at activation terminal 714 where the resulting floating voltage maintains or approximately maintains its initial value. Operating voltage VDD is enabled to be received by memory elements of memory device 700 that are not included in the first set. For example, first terminal 710*a* of memory element 702*a*, and any other of first terminals 710*b*-710*d* and 710*f*-710*l* of memory elements to be programmed in the second programming phase or to be not programmed during the example memory write operation, may be configured to receive operating voltage VDD in the first programming phase. Additionally, second terminals 712*a*-712*c* are configured to receive operating voltage VDD in the first programming phase. When second terminals 712*a*-712*c* concurrently transition from reference voltage VSS to operating voltage VDD in the first programming phase, a boost voltage is added to the floating operating voltage at activation terminal 714. In embodiments, the boost voltage is approximately twice the initially floated operating voltage when unused, unselected, and parallel programmed memory elements provide the voltage boost, and anti-parallel data values are programmed for memory elements of the first set according to the techniques described herein. The operating voltage VDD and the reference voltage VSS may be provided and enabled to be received according the operation of programming configuration logic 716 described herein.

During the second programming phase, the reference voltage is enabled to be received by the first terminals of the memory elements of the first set and of the third set, and by the second terminals of the memory elements of the first set, of the second set, and of the third set, and the operating voltage is enabled to be received by the activation terminals of the memory elements of the first set, of the second set, and of the third set (906). For instance, in the example memory operation, second terminals 712*a*-712*c* transitioned from operating voltage VDD to reference voltage VSS. First terminal 710*e* of memory component 702*b* is configured to maintain/receive reference voltage VSS, and any first terminals 710*b*-710*d* and 710*f*-710*l* of memory elements in memory device 700 that are not in set 2 (not to be programmed during the second programming phase) are configured to receive reference voltage VSS. Additionally, operating voltage VDD is enabled to be received by activation terminal 714, and parallel data values are programmed for memory elements of the second set according to the techniques described herein. The operating voltage VDD and the reference voltage VSS may be provided and enabled to be received according the operation of programming configuration logic 716 described herein.

In some example embodiments, one or more of operations 902, 904, and/or 906 of flowchart 900 may not be performed. Moreover, operations in addition to or in lieu of operations 902, 904, and/or 906 may be performed. Further, in some example embodiments, one or more of operations 902, 904, and/or 906 may be performed out of order, in an alternate sequence, or partially (or completely) concurrently with each other or with other operations.

IV. Further Example Embodiments and Advantages

As noted above, systems and devices, including memory systems and devices, may be configured in various ways to perform two phase boosting to program anti-parallel data values during a first programming phase and to program parallel data values during a second programming phase that is subsequent to the first programming phase according to the techniques and embodiments provided. For instance, in embodiments, memory elements of a memory device are programmed with anti-parallel data values in a first programming phase using a voltage boost according to the techniques and embodiments herein, and memory elements of the memory device are programmed with parallel data values in a subsequent second programming phase.

The described voltage boosting techniques may effectively double the activation voltage for memory elements to be programmed with anti-parallel data values in the first programming phase due to the near 100% capacitive couple between gate-source and gate-drain components of the transistors in the memory elements. The high ratio of boosting memory elements to non-boosting memory elements in the described techniques virtually eliminates voltage and oxide stresses of transistor components that are present in prior memory solutions. That is, a large number memory elements are configured to provide the voltage boost by transitioning from a reference voltage to an operating voltage on their source lines at the same time. This allows for the selection of smaller transistors for memory elements in the described embodiments. Accordingly, the area of memory elements may be reduced, e.g., an approximately 60% element width reduction versus current memory solutions that utilize traditional, selective boosting in which only about 25% of available memory elements can boost, where the available memory elements comprise approximately ½ to ⅞ of the total elements.

Because the application of overvoltages and corresponding oxide stress associated with traditional, selective boosting are virtually non-existent according to the described voltage boosting techniques, normal operating voltage (VDD) tolerances are present in memory device embodiments, and operating voltage monitoring for reliability is significant reduced or not required. The inventive techniques also provide for low-cost, high-reliability memories such as MRAMs that are higher cycle non-volatile memories with greater density memory options for products with respect to cost/reliability factors over prior approaches.

Furthermore, decoding logic, such as decoder 720 of FIG. 7, may be optimized for area reduction rather than for determining a boost ratio (i.e., which memory elements are to provide a traditional, selective boost in a single programming phase) as in current solutions.

In embodiments, it is also contemplated that selective boosting may be applied during the second programming phase, and that the activation signal during the second programming phase may be provided as VDD with no additional boosting.

The described techniques and embodiments may be utilized in any resistive memory systems and devices, for example and not by way of limitation, MRAM and RRAM, and the advantages described herein may become even more beneficial as semiconductor devices continue to use increasingly larger and larger memories. The described techniques and embodiments provide value and performance benefits to products and industries that drive for increasing amounts of memory capacity. However, any chip architecture using can benefit from the density and memory capacity advantages provided herein.

The further example embodiments and advantages described in this Section may be applicable to embodiments disclosed in any other Section of this disclosure.

Embodiments and techniques, including methods, described herein may be performed in various ways such as, but not limited to, being implemented by hardware, or hardware combined with one or both of software and firmware. For example, embodiments may be implemented as resistive memory systems and devices, such as MRAM and RRAM, specifically customized hardware, ASICs, electrical circuitry, and/or the like.

V. Example Computer Implementations

Memory element anti-parallel programming phase configuration 200A of FIG. 2A, memory element parallel programming phase configuration 200B of FIG. 2B, memory device 402 of FIG. 4, and/or memory device 700 of FIG. 7, along with any respective components/subcomponents thereof, and/or any flowcharts, further systems, sub-systems, and/or components disclosed herein may be implemented in hardware (e.g., hardware logic/electrical circuitry), or any combination of hardware with one or both of software (computer program code or instructions configured to be executed in one or more processors or processing devices) and firmware. In embodiments with respect to the example computer implementations in this Section, main memory, memory cards and memory sticks, memory devices, and/or the like may include and or implement the described techniques and embodiments.

Figure 10:
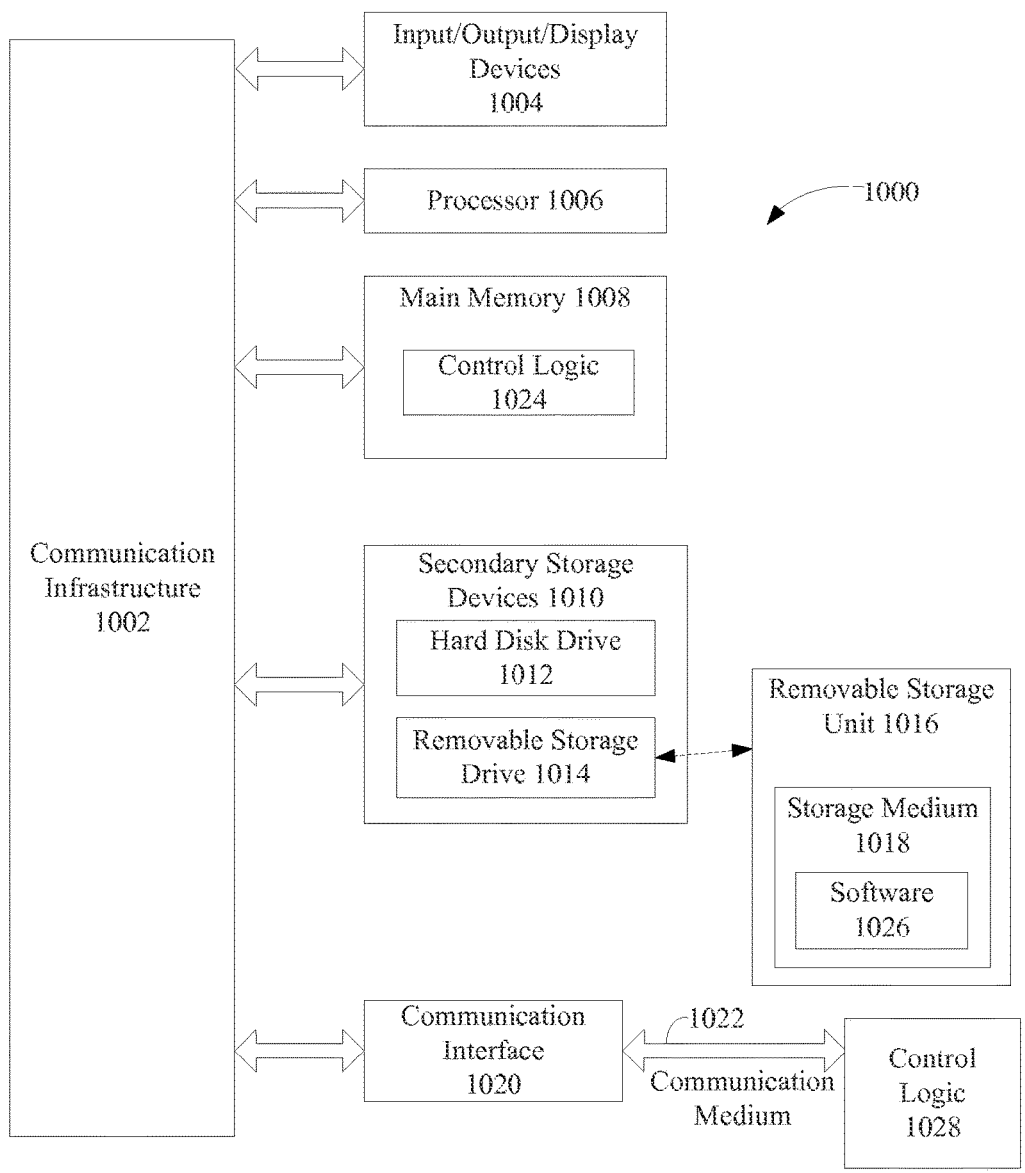
FIG. 10 shows a block diagram of a computing device/system in which the techniques disclosed herein may be performed and the embodiments herein may be utilized.

The embodiments described herein, including circuitry, devices, systems, methods/processes, and/or apparatuses, may be implemented in or using well known processing devices, communication systems, servers, and/or, computers, such as a processing device 1000 shown in FIG. 10. It should be noted that processing device 1000 may represent communication devices/systems, entertainment systems/devices, processing devices, and/or traditional computers in one or more embodiments. For example, analog-to-digital conversion circuits for spread spectrum noise reduction, and any of the sub-systems and/or components respectively contained therein and/or associated therewith, may be implemented in or using one or more processing devices 1000 and similar computing devices.

Processing device 1000 can be any commercially available and well known communication device, processing device, and/or computer capable of performing the functions described herein, such as devices/computers available from International Business Machines®, Apple®, Sun®, HP®, Dell®, Cray®, Samsung®, Nokia®, etc. Processing device 1000 may be any type of computer, including a desktop computer, a server, etc., and may be a computing device or system within another device or system.

Processing device 1000 includes one or more processors (also called central processing units, or CPUs), such as a processor 1006. Processor 1006 is connected to a communication infrastructure 1002, such as a communication bus. In some embodiments, processor 1006 can simultaneously operate multiple computing threads, and in some embodiments, processor 1006 may comprise one or more processors.

Processing device 1000 also includes a primary or main memory 1008, such as random access memory (RAM). Main memory 1008 has stored therein control logic 1024 (computer software), and data.

Processing device 1000 also includes one or more secondary storage devices 1010. Secondary storage devices 1010 include, for example, a hard disk drive 1012 and/or a removable storage device or drive 1014, as well as other types of storage devices, such as memory cards and memory sticks. For instance, processing device 1000 may include an industry standard interface, such a universal serial bus (USB) interface for interfacing with devices such as a memory stick. Removable storage drive 1014 represents a floppy disk drive, a magnetic tape drive, a compact disk drive, an optical storage device, tape backup, etc.

Removable storage drive 1014 interacts with a removable storage unit 1016. Removable storage unit 1016 includes a computer useable or readable storage medium 1018 having stored therein computer software 1026 (control logic) and/or data. Removable storage unit 1016 represents a floppy disk, magnetic tape, compact disk, DVD, optical storage disk, or any other computer data storage device. Removable storage drive 1014 reads from and/or writes to removable storage unit 1016 in a well-known manner.

Processing device 1000 also includes input/output/display devices 1004, such as touchscreens, LED and LCD displays, monitors, keyboards, pointing devices, etc.

Processing device 1000 further includes a communication or network interface 1020. Communication interface 1020 enables processing device 1000 to communicate with remote devices. For example, communication interface 1020 allows processing device 1000 to communicate over communication networks or mediums 1022 (representing a form of a computer useable or readable medium), such as LANs, WANs, the Internet, etc. Network interface 1020 may interface with remote sites or networks via wired or wireless connections.

Control logic 1028 may be transmitted to and from processing device 1000 via the communication medium 1022.

Any apparatus or manufacture comprising a computer useable or readable medium having control logic (software) stored therein is referred to herein as a computer program product or program storage device. This includes, but is not limited to, processing device 1000, main memory 1008, secondary storage devices 1010, and removable storage unit 1016. Such computer program products, having control logic stored therein that, when executed by one or more data processing devices, cause such data processing devices to operate as described herein, represent embodiments.

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, capabilities, and functions therein and/or further embodiments described herein.

Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media and signals transmitted over wired media. Embodiments are also directed to such communication media.

The techniques and embodiments described herein may be implemented as, or in, various types of devices. For instance, embodiments may be included, without limitation, in processing devices (e.g., illustrated in FIG. 10) such as computers and servers, as well as communication systems such as switches, routers, gateways, and/or the like, communication devices such as smart phones, home electronics, gaming consoles, entertainment devices/systems, etc. A device, as defined herein, is a machine or manufacture as defined by 35 U.S.C. §101. That is, as used herein, the term "device" refers to a machine or other tangible, manufactured object and excludes software and signals. Devices may include digital circuits, analog circuits, or a combination thereof. Devices may include one or more processor circuits (e.g., central processing units (CPUs), processor 1006 of FIG. 10), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

VI. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A memory device, comprising:
  a plurality of memory elements configured to store data; and
  programming configuration logic configured to program each of the memory elements to a first data value during a first programming phase or a second data value during a second programming phase that is subsequent to the first programming phase by enabling connections to a first voltage or a second voltage for each of the memory elements;
  wherein a first memory element of the plurality of memory elements includes first and second terminals configured to receive the first voltage or the second voltage based on the connections enabled by the programming configuration logic;
  wherein the first voltage is an operating voltage and the second voltage is a reference voltage, and wherein to program a desired data value for the first memory element:
    during the first programming phase, the programming configuration logic is configured to enable the first memory element to receive the second voltage at the first terminal and the first voltage at the second terminal where the first data value is the desired data value, and
    during the second programming phase, the programming configuration logic is configured to enable the first memory element to receive the first voltage at the first terminal and the second voltage at the second terminal where the second data value is the desired data value;
  wherein the programming configuration logic is further configured to setup each of the memory elements in a setup phase that is prior to the first programming phase,
  wherein the second terminal is configured to receive the second voltage during the setup phase, and
  wherein the first terminal is configured to receive the first voltage during the setup phase for programming of the first data value, or receive the second voltage during the setup phase for programming of the second data value.

2. A memory device, comprising:
  a plurality of memory elements configured to store data; and
  programming configuration logic configured to program each of the memory elements to a first data value during a first programming phase or a second data value during a second programming phase that is subsequent to the first programming phase by enabling connections to a first voltage or a second voltage for each of the memory elements;
  wherein a first memory element of the plurality of memory elements includes first and second terminals configured to receive the first voltage or the second voltage based on the connections enabled by the programming configuration logic;
  wherein the programming configuration logic is further configured to enable a programming activation input to be received by each of the memory elements;
  wherein the first memory element includes an activation terminal configured to receive the programming activation input, and
  wherein the first memory element is configured to receive the programming activation input at a voltage level that is:
    approximately twice the first voltage during the first programming phase according to a voltage boost, and
    at least approximately equal to the first voltage during the second programming phase.

3. The memory device of claim 2, wherein one or more unused memory elements of the plurality of memory elements are configured to:
  provide at least a portion of the voltage boost resulting from a transition from a setup phase to the first programming phase.

4. The memory device of claim 3, wherein each of the one or more unused memory elements comprise a third terminal and a fourth terminal, and are configured to provide at least a portion of the voltage boost in response to the programming configuration logic enabling the third terminal and the fourth terminal to receive the first voltage.

5. The memory device of claim 4, wherein the one or more unused memory elements comprise a majority of the plurality of memory elements.

6. The memory device of claim 2, wherein the programming configuration logic is configured to select one or more memory elements of the plurality of memory elements other than the first memory element to perform a selective boost to the programming activation input received at the activation terminal of the first memory element during the second programming phase.

7. The memory device of claim 1, wherein each other memory element of the plurality of memory elements also includes a first terminal, a second terminal, and an activation terminal; and
  wherein the programming configuration logic is configured to:
    determine whether the first voltage or the second voltage is received at the first terminal and at the second terminal of the first memory element during the first programming phase and during the second programming phase;
    determine whether the first voltage or the second voltage is received at the first and second terminals of each other memory element of the plurality of memory elements during the first programming phase and during the second programming phase; and
    transition to the first programming phase and subsequently to the second programming phase.

8. The memory device of claim 1, wherein each of the plurality of memory elements comprises a magnetic tunneling junction (MTJ) device and a transistor, the MTJ device and the transistor being electrically coupled together.

9. The memory device of claim 1, wherein the memory device is a magnetoresistive random access memory (MRAM).

10. A method in a memory device, comprising:
receiving a reference voltage at a first terminal and an operating voltage at an activation terminal of a first memory element of the memory device during a setup phase; and
during a first programming phase:
transitioning a second terminal of the first memory element and a second terminal of a second memory element of the memory device from the reference voltage to the operating voltage to increase the operating voltage at the activation terminal of the first memory element, the reference voltage received at the second terminal of the first memory element and the second terminal of the second memory element prior to said transitioning; and
programming a first data value at the first memory element.

11. The method of claim 10, further comprising:
receiving the operating voltage at a first terminal and at an activation terminal of a third memory element of the memory device during the setup phase; and
during a second programming phase that is subsequent to the first programming phase:
transitioning the second terminal of the first memory element, the second terminal of the second memory element, and a second terminal of the third memory element from the operating voltage to the reference voltage to decrease the operating voltage at the activation terminal of the third memory element; and
programming a second data value at the third memory element.

12. The method of claim 11, wherein anti-parallel data values are programmed during the first programming phase; and
wherein parallel data values are programmed during the second programming phase.

13. The method of claim 10, wherein increasing the operating voltage at the activation terminal of the first memory element comprises boosting the operating voltage by approximately a factor of two from the setup phase.

14. The method of claim 13, wherein the operating voltage at the activation terminal is floated at the operating voltage during the first programming phase.

15. A memory device, comprising:
a first set of memory elements configured to be programmed with a first data value during a first programming phase;
a second set of memory elements configured to be programmed with a second data value during a second programming phase that is subsequent to the first programming phase;
a third set of memory elements comprising memory elements configured to not be programmed during the first programming phase and the second programming phase; and
programming configuration logic;
each memory element of the first set, the second set, and the third set having a respective first terminal, a respective second terminal, and a respective activation terminal;
the programming configuration logic being configured to:
during a setup phase that is prior to the first programming phase:
enable an operating voltage to be received by first terminals of the memory elements of the second set and by activation terminals of the memory elements of the first set, of the second set, and of the third set, and enable a reference voltage to be received by first terminals of the memory elements of the first set and of the third set and by second terminals of the first set, of the second set, and of the third set; and
during the first programming phase:
enable the activation terminals of the memory elements of the first set, of the second set, and of the third set to initially be driven at the operating voltage and then be left floating; and
enable the operating voltage to be received by the first terminals of the memory elements of the second set and of the third set, and by the second terminals of the memory elements of the first set, of the second set, and of the third set to apply a boost voltage to the activation terminals of the first set, the second set, and the third set, wherein the boost voltage is approximately twice the operating voltage.

16. The memory device of claim 15, wherein the programming configuration logic is configured to:
during the second programming phase:
enable the reference voltage to be received by the first terminals of the memory elements of the first set and of the third set and by the second terminals of the memory elements of the first set, of the second set, and of the third set; and
enable the operating voltage to be received by the activation terminals of the memory elements of the first set, of the second set, and of the third set.

17. The memory device of claim 16, wherein the first data value corresponds to an anti-parallel programming value; and
wherein the second data value corresponds to a parallel programming value.

18. The memory device of claim 16, wherein the programming configuration logic is configured to transition between the setup phase, the first programming phase, and the second programming phase according to a phase state that is based on a state machine or a linear delay chain.

19. The memory device of claim 15, wherein the third set of memory elements comprise a majority of memory elements of the first set of memory elements, the second set of memory elements, and the third set of memory elements combined.

20. The memory device of claim 1, wherein anti-parallel data values are programmed during the first programming phase; or
wherein parallel data values are programmed during the second programming phase.

* * * * *